United States Patent
Lahoti et al.

[11] Patent Number: 6,164,520
[45] Date of Patent: Dec. 26, 2000

[54] ROBUST THICK FILM CONDUCTORS

[75] Inventors: Ashish Lahoti, Hatfield; Susan Lynn Marr, Yardley; David James Leandri, Skippack, all of Pa.

[73] Assignee: Visteon Global Technologies, Inc., Dearborn, Mich.

[21] Appl. No.: 09/439,404

[22] Filed: Nov. 11, 1999

[51] Int. Cl.[7] .................... B23K 31/00; B23K 31/02; B32B 15/04; H05K 3/00
[52] U.S. Cl. .................... 228/123.1; 228/123.1; 228/180.21; 228/180.22; 428/457; 29/829
[58] Field of Search .................... 228/123.1, 180.21, 228/180.22, 6.2; 438/26, 51, 55, 64, 119; 428/209, 457; 29/829

[56] References Cited

U.S. PATENT DOCUMENTS

| | | | |
|---|---|---|---|
| 4,132,341 | 1/1979 | Bratschum | 228/122 |
| 4,739,917 | 4/1988 | Baker | 228/123 |
| 4,939,022 | 7/1990 | Palanisamy | 428/209 |
| 5,485,294 | 1/1996 | Sugiyama et al. | 359/58 |
| 5,803,343 | 9/1998 | Sarma et al. | 228/180.21 |
| 5,803,344 | 9/1998 | Stankavich et al. | 228/180.22 |
| 5,831,828 | 11/1998 | Cutting et al. | 361/704 |
| 5,832,595 | 11/1998 | Maruyama et al. | 29/829 |
| 5,924,623 | 7/1999 | Kenney | 228/180.22 |
| 5,939,969 | 8/1999 | Doerrwachter et al. | 337/297 |
| 5,966,067 | 10/1999 | Murakami et al. | 338/309 |

*Primary Examiner*—Patrick Ryan
*Assistant Examiner*—Colleen Cooke
*Attorney, Agent, or Firm*—Mark L. Mollon

[57] ABSTRACT

A robust thick film conductor construction making an electric circuit connection of an electric component (20) to a Ag:Pd conductor (12) on a substrate. A substantially pure Ag conductor (10) is printed, dried, and fired on the substrate, then the Ag:Pd conductor is printed, dried, and fired such that a portion of the latter overlaps a portion of the Ag conductor. A first solder layer (16) is printed over the Ag conductor, including the overlap region (14), and reflowed. A second solder layer (18) is printed over the first printed solder layer at a region where the component (20) is to be placed and is reflowed after placement of the component to thereby join with the component.

4 Claims, 1 Drawing Sheet

ROBUST THICK FILM CONDUCTORS

BACKGROUND OF THE INVENTION

1. Field of the Invention

This invention relates to thick film conductors, particularly those in hybrid circuits for connecting discrete and printed components on a circuit board.

2. Background Information

Silver (Ag) and silver:palladium (Ag:Pd) are two conductors that are commonly used in hybrid circuits. Each possesses its own unique advantages. Ag has extremely high electrical conductivity. It is excellent for soldering, retaining high conductivity after some dissolution into a solder. A properly soldered joint exhibits good fatigue resistance. Ag is relatively cost-effective compared to certain other conductors, and it prints well on an underlying substrate, such as a ceramic substrate. Ag:Pd provides robustness against contamination and corrosion.

SUMMARY OF THE INVENTION

The present invention relates to a method for making a robust thick film conductor that embodies advantageous benefits of both Ag and Ag:Pd.

A general aspect of the within claimed invention relates to a method of making an electric circuit connection of an electric component to a Ag:Pd conductor on a substrate, the method comprising: creating a substantially pure Ag printed conductor on the substrate; creating a Ag:Pd printed conductor on the substrate, including overlapping a portion of the Ag conductor with a portion of the Ag:Pd conductor at an overlap region; creating a first printed solder layer that covers the Ag conductor, including the overlap region; creating a second printed solder layer that covers the first printed solder layer at a region where the component is to be placed; placing the component at the latter region and joining the component to the second printed layer.

Another general aspect relates to a robust thick film conductor construction making an electric circuit connection of an electric component to a Ag:Pd conductor on a substrate, the construction comprising: a substantially pure Ag printed conductor on the substrate; a Ag:Pd printed conductor on the substrate comprising a portion overlapping a portion of the Ag conductor at an overlap region; a first printed solder layer that covers the Ag conductor, including the overlap region; a second printed solder layer that covers the first printed solder layer at a region where the component is placed and joins with the component.

Other general and more specific aspects will been set forth in the ensuing description and claims.

BRIEF DESCRIPTION OF THE DRAWINGS

The drawings that will now be briefly described are incorporated herein to illustrate a preferred embodiment of the invention and a best mode presently contemplated for carrying out the invention.

DESCRIPTION OF THE PREFERRED EMBODIMENT

Figure 1:
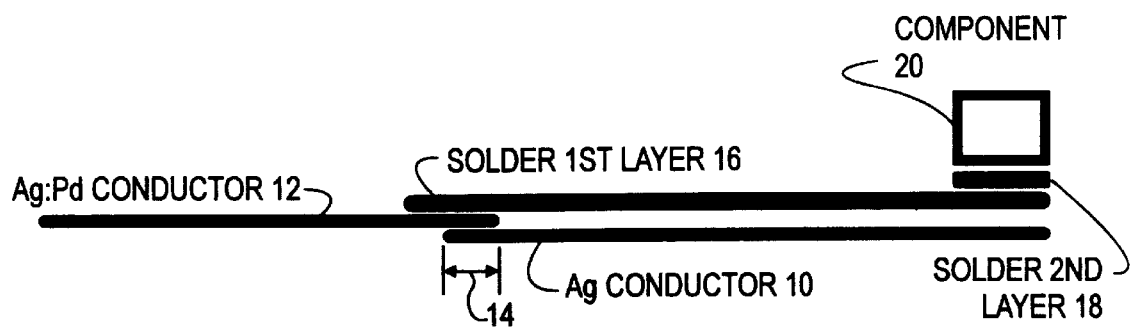
FIG. 1 is side elevation view of a conductor according to principles of the present invention.
Figure 2:
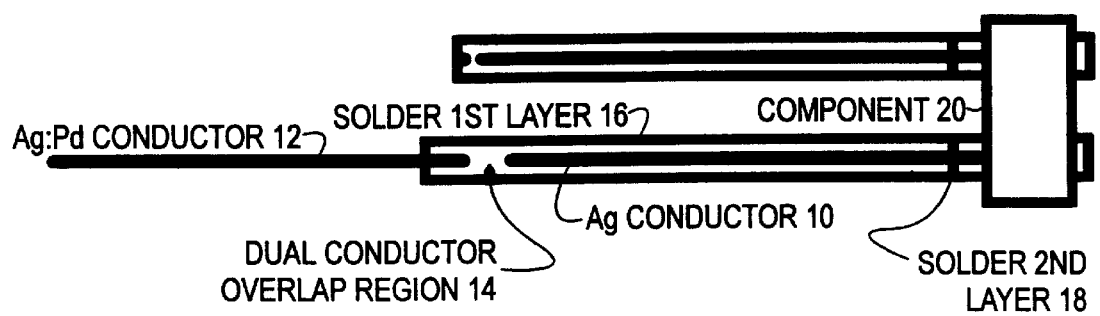
FIG. 2 is top plan view of FIG. 1.

FIGS. 1 and 2 show a pure Ag conductor 10 that has been printed on an underlying substrate, which is not expressly shown in the Figures. A Ag:Pd conductor 12 is also printed on the substrate, but with a portion of it overlapping an underlying portion of conductor 10. This region of overlap is marked by the reference numeral 14 in FIG. 1. A solder layer 16 is printed on the substrate in covering relation to Ag conductor 10, including overlap region 14. A second solder layer 18 is printed over a region of solder layer 16 where an electrical connection to an electric component 20 is to be made.

A process for fabrication comprises the following sequence of steps. Ag conductor 10 is printed, dried, and then fired. Next, Ag:Pd conductor 12 is printed, dried, and fired. Next, solder layer 16 is printed, reflowed, and washed to remove flux residue. Next, solder layer 18 is printed over the region of solder layer where component 20 is to be placed. Component 20 is then placed. Finally, solder layer 18 is reflowed. Each of these individual steps in the inventive fabrication method is performed using known processing and equipment.

This method creates an electric circuit connection of component 20 to conductor 12 which is characterized by the excellent conductivity of Ag in the underlying conductor 10, while the overlying solder layer 16 forms a passivation layer that protects the underlying Ag against corrosion (especially sulfur corrosion) and contamination. The Ag:Pd of conductor 12 is inherently robust to corrosion and contamination. The invention embodies metallurgical, electrical, and relative cost advantages of Ag while the Ag is being protected against corrosion and contamination. Each overlying layer has direct surface-to-surface contact with a underlying layer, with some dissolution of the conductors into the solder layers as a result of solder reflowing. Component 20 is any electric conductor that is suitable for soldering.

A suitable solder for solder layers 16, 18 is 10Sn/88Pb/2Ag and 62Sn/36Pb/2Ag respectively. While conductor 10 has been described as pure Ag, substantially pure Ag is also considered a suitable material for conductor 10.

While a presently preferred embodiment has been illustrated and described, it is to be appreciated that the invention may be practiced in various forms within the scope of the following claims.

What is claimed is:

1. A method of making an electric circuit connection of an electric component to a Ag:Pd conductor on a substrate, the method comprising:

creating a substantially pure Ag printed conductor on the substrate;

creating a Ag:Pd printed conductor on the substrate, including overlapping a portion of the Ag conductor with a portion of the Ag:Pd conductor at an overlap region;

creating a first printed solder layer that covers the Ag conductor, including the overlap region;

creating a second printed solder layer that covers the first printed solder layer at a region where the component is to be placed;

placing the component at the latter region and joining the component to the second printed layer.

2. A method as set forth in claim 1 in which the step of creating a substantially pure Ag printed conductor on the substrate comprises printing, drying, and firing the Ag, and the step of creating a Ag:Pd printed conductor on the substrate, including overlapping a portion of the Ag conductor with a portion of the Ag:Pd conductor at an overlap region, comprises printing, drying, and firing the Ag:Pd.

3. A method as set forth in claim 2 in which the step of creating a first printed solder layer that covers the Ag conductor, including the overlap region comprises printing and reflowing the first solder, the step of creating a second printed solder layer that covers the first printed solder layer at a region where the component is to be placed comprises printing the second solder, and the step of joining the component to the second printed layer comprises reflowing the second solder.

4. A robust thick film conductor construction making an electric circuit connection of an electric component to a Ag:Pd conductor on a substrate, the construction comprising:
- a substantially pure Ag printed conductor on the substrate;
- a Ag:Pd printed conductor on the substrate comprising a portion overlapping a portion of the Ag conductor at an overlap region;
- a first printed solder layer that covers the Ag conductor, including the overlap region;
- a second printed solder layer that covers the first printed solder layer at a region where the component is placed and joins with the component.

* * * * *